United States Patent
Healy et al.

(10) Patent No.: US 10,027,349 B2
(45) Date of Patent: Jul. 17, 2018

(54) EXTENDED ERROR CORRECTION CODING DATA STORAGE

(71) Applicant: International Business Machines Corporation, Armonk, NY (US)

(72) Inventors: Michael B. Healy, Cortlandt Manor, NY (US); Hillery C. Hunter, Chappaqua, NY (US); Charles A. Kilmer, Essex Junction, VT (US); Kyu-hyoun Kim, Chappaqua, NY (US); Warren E. Maule, Cedar Park, TX (US); Adam J. McPadden, Underhill, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 177 days.

(21) Appl. No.: 14/835,804

(22) Filed: Aug. 26, 2015

(65) Prior Publication Data

US 2016/0342473 A1 Nov. 24, 2016

Related U.S. Application Data

(63) Continuation of application No. 14/717,254, filed on May 20, 2015.

(51) Int. Cl.
*G06F 11/10* (2006.01)
*G11C 29/00* (2006.01)
*H03M 13/00* (2006.01)

(52) U.S. Cl.
CPC ....... *H03M 13/618* (2013.01); *G06F 11/1016* (2013.01)

(58) Field of Classification Search
CPC . H03M 13/618; H03M 13/25; G06F 11/1008; G06F 11/1048; G06F 11/1044; G06F 11/073; G06F 3/0679; G06F 11/1068; G06F 11/1666; G06F 3/064; G06F 11/2094; G06F 3/0614; G06F 11/1076; G06F 3/0619; G06F 3/0689;
(Continued)

(56) References Cited

U.S. PATENT DOCUMENTS

| | | | | |
|---|---|---|---|---|
| 8,341,498 B2* | 12/2012 | D'Abreu | ............. | G06F 11/1048 714/760 |
| 8,438,457 B2* | 5/2013 | Koshiyama | ......... | G06F 11/1068 365/185.09 |

(Continued)

OTHER PUBLICATIONS

List of IBM Patents or Patent Applications Treated as Related; (Appendix P), Filed Aug. 26, 2015; 2 pages.

(Continued)

*Primary Examiner* — Phung M Chung
(74) *Attorney, Agent, or Firm* — Cantor Colburn LLP

(57) ABSTRACT

A memory management system and a method of managing a memory device are described. The system includes a memory device with a memory array to store data and associated error correction coding (ECC) bits and an extended correction table. The extended correction table stores error information additional to the ECC bits for one or more of the data in the memory array. The system also includes a controller to control the memory device to write and read the data.

9 Claims, 14 Drawing Sheets

(58) Field of Classification Search
CPC ............ G11B 2020/1222; G11B 20/18; G11B 20/1833; G11C 16/10; G11C 16/26; G11C 29/52
See application file for complete search history.

(56) References Cited

U.S. PATENT DOCUMENTS

| | | | | |
|---|---|---|---|---|
| 8,484,542 B2* | 7/2013 | d—Abreu | ............ | G06F 11/1012 714/763 |
| 8,914,708 B2* | 12/2014 | Meaney | ................ | H03M 13/05 714/766 |
| 9,065,481 B2* | 6/2015 | Meaney | ................ | H03M 13/05 |
| 2011/0307758 A1* | 12/2011 | Fillingim | ............ | G06F 11/1048 714/758 |
| 2012/0084622 A1* | 4/2012 | D'Abreu | ............. | G06F 11/1048 714/755 |
| 2013/0311849 A1* | 11/2013 | Miyachi | ................ | H03M 13/29 714/758 |
| 2014/0149827 A1* | 5/2014 | Kim | .................... | G06F 11/1064 714/764 |
| 2014/0289575 A1* | 9/2014 | Sutardja | .............. | G06F 11/1008 714/723 |

OTHER PUBLICATIONS

Michael B. Healy et al., "Extended Error Correction Coding Data Storage", U.S. Appl. No. 14/717,254, filed May 20, 2015.

* cited by examiner

```
If (Error?)
{
    Retry read;
    If (CE?)
    {
        Increment error counter for the address;
        (*) This counter is per DRAM
        If(count > threshold)
        {
            Tell the memory to calculate 2nd ECC
                and add the buffer contents
                to the table as a new entry;
            (*) Use DQ pin to select the specific device
        }
    }
    If (UE?)
    {
        Correct error using controller ECC;
        Send the corrected data to the memory buffer;
        Tell the memory to calculate 2nd ECC
            and add the buffer contents
            to the table as a new entry;
    }
}
```

```
Read request received
Fetch data & ECC from memory array
If (IB=0 ?)
{
    Check 1st ECC;
    If (CE?)
    {
        Send data;
        Report CE;
        Add a new entry to the table;
    }
}
Else
{
    Check 2nd ECC;
    If (CE?)         Send data;
    Else             Report UE;
}
```

```
Read request received
Fetch data & ECC from memory array
If (IB=0 ?)
{
    Check 1st ECC;
    If (CE?)
    {
        Send data;
        Report CE;
        Add a new entry to the table;
    }
}
Else
{
    Fetch 2nd ECC(2/2) from the table, and make up the complete 2nd ECC word;
    Check 2nd ECC;
    If (CE?)
        Send data;
    Else
        Report UE;
}
```

```
Read request received
Fetch data & ECC from memory array
If (IB=0 ?)
{
    Check 1st ECC;
    If (CE?)
    {
        Send data;
        Report CE;
        Add a new entry to the table;
    }
}
Else
{
    Check 2nd ECC; (2nd ECC has stronger detection capability than 1st ECC,
                    but has no correction capability)
    If (no error)
        Send data;
    Else
    {
        Fetch 3rd ECC from the able;
        Check 3rd ECC;
        If (CE?)
            Send data;
        Else
            Report UE;
    }
}
```

```
Read request received;
Fetch data & ECC from memory array;
If (Error?) /* All errors are assumed to be correctable for simplicity in this case */
{
    Check ECC and correct data;
    Send data;
    Lookup the extended ECC table;
    If (entry was not found OR syndrome doesn't match)
    {
        Store address and data to a buffer;
        Send attention flag;
        (*) This can be done using an Alert pin, or corrupting the next
            read data (so the controller can detect event using
            system level ECC) or the next read's CRC field.
    }
}
```

EXTENDED ERROR CORRECTION CODING DATA STORAGE

This application is a continuation of U.S. application Ser. No. 14/717,254 filed May 20, 2015, the disclosure of which is incorporated by reference herein in its entirety.

BACKGROUND

The present invention relates to memory management, and more specifically, to extended error correction coding data storage.

In management of memory devices (e.g., dynamic random-access memory (DRAM)), error correction coding (ECC) bits are encoded with stored data in order to correct data that is read out or output from the memory device. In an exemplary memory array, 64 bits of data may be associated with 8 ECC bits. Typically, memory addresses and associated ECC bits are read out and decoded to generate an error vector that is used to correct the data that is read out.

SUMMARY

According to an embodiment, a memory management system includes a memory device comprising a memory array configured to store data and associated error correction coding (ECC) bits and an extended correction table, the extended correction table storing error information additional to the ECC bits for one or more of the data in the memory array; and a controller configured to control the memory device to write and read the data.

According to another embodiment, a method of managing a memory device includes storing, using a memory controller, data and associated error correction coding (ECC) bits in a memory array of the memory device; storing information additional to the ECC bits in correspondence with one or more of the data in the memory array in an extended correction table in the memory device; and using the information in the extended correction table to output requested data from the memory array.

According to yet another embodiment, a computer program product to manage a memory device includes a computer readable storage medium having program code embodied therewith, the program code executable by a processor to perform a method including storing data and associated error correction coding (ECC) bits in a memory array of the memory device; storing information additional to the ECC bits in correspondence with one or more of the data in the memory array in an extended correction table in the memory device; and using the information in the extended correction table to output requested data from the memory array.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 4 shows instructions to create or add to the extended ECC table according to an embodiment;

FIG. 8 shows instructions to manage the memory device according to the embodiment discussed with reference to FIG. 7;

FIG. 10 shows instructions to manage the memory device according to the embodiment discussed with reference to FIG. 9;

FIG. 13 shows instructions to manage the memory device according to the embodiment discussed with reference to FIG. 12.

DETAILED DESCRIPTION

As noted above, ECC bits are generally included with stored data in a memory device to correct errors in the value of the data in one or more memory locations during readout. The error probability at each memory location is not equal, because some memory cells may be weaker than others. Thus, using the same number of ECC bits for all memory addresses is not efficient or most effective. While each memory address may ideally have a different number of ECC bits associated with it, such selective assignment is difficult to implement and update efficiently. Prior systems have implemented additional error correction in the software involved in reading out the data from the memory device, rather than within the memory device, for some memory addresses. Embodiments of the systems and methods detailed herein relate to an extended ECC table.

Figure 1:
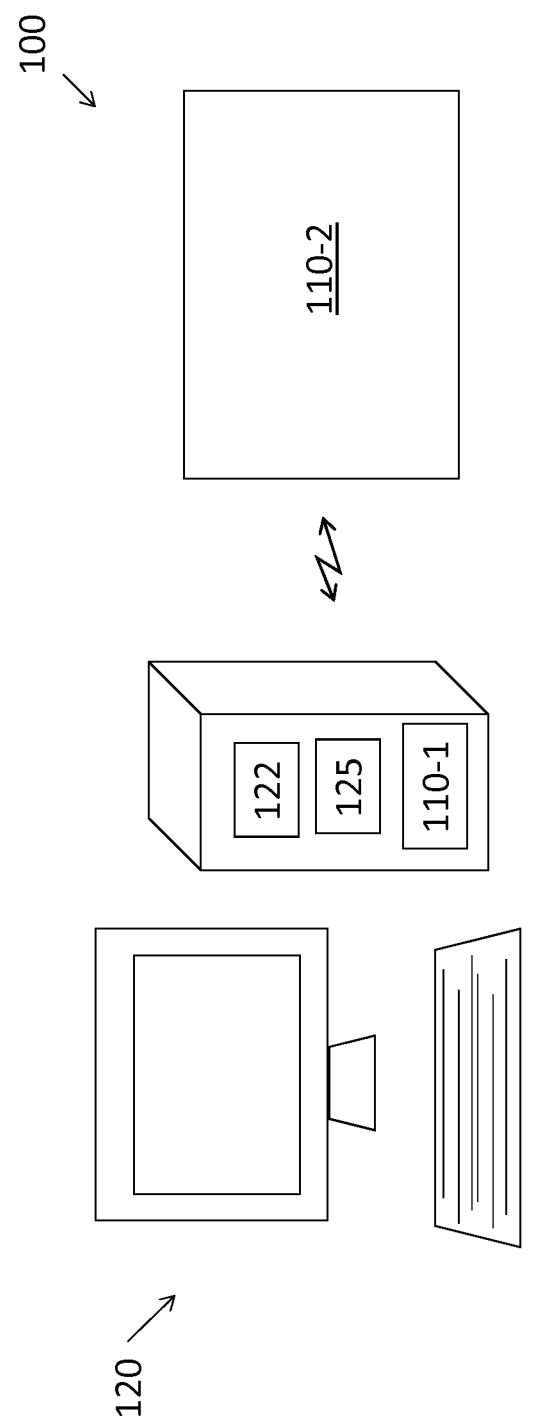
FIG. 1 is an overview of a memory management system according to embodiments of the invention.

FIG. 1 is an overview of a memory management system 100 according to embodiments of the invention. A processing system 120 including processing circuitry is shown. The processing system 120 includes an interface 122 for communication outside the processing system 120, one or more processors 125, and one or more memory devices 110. The processing system 120 may act as a memory controller determining the data and ECC bits stored in and read out of the memory device 110-1. The processing system 120 may additionally or alternately communicate with one or more external memory devices 110-1. The (internal or external) memory devices 110 may be dynamic random-access memory (DRAM) devices, for example. As further detailed with reference to FIG. 2, the memory device 110 may include a memory array, buffer, and non-volatile memory.

Figure 2:
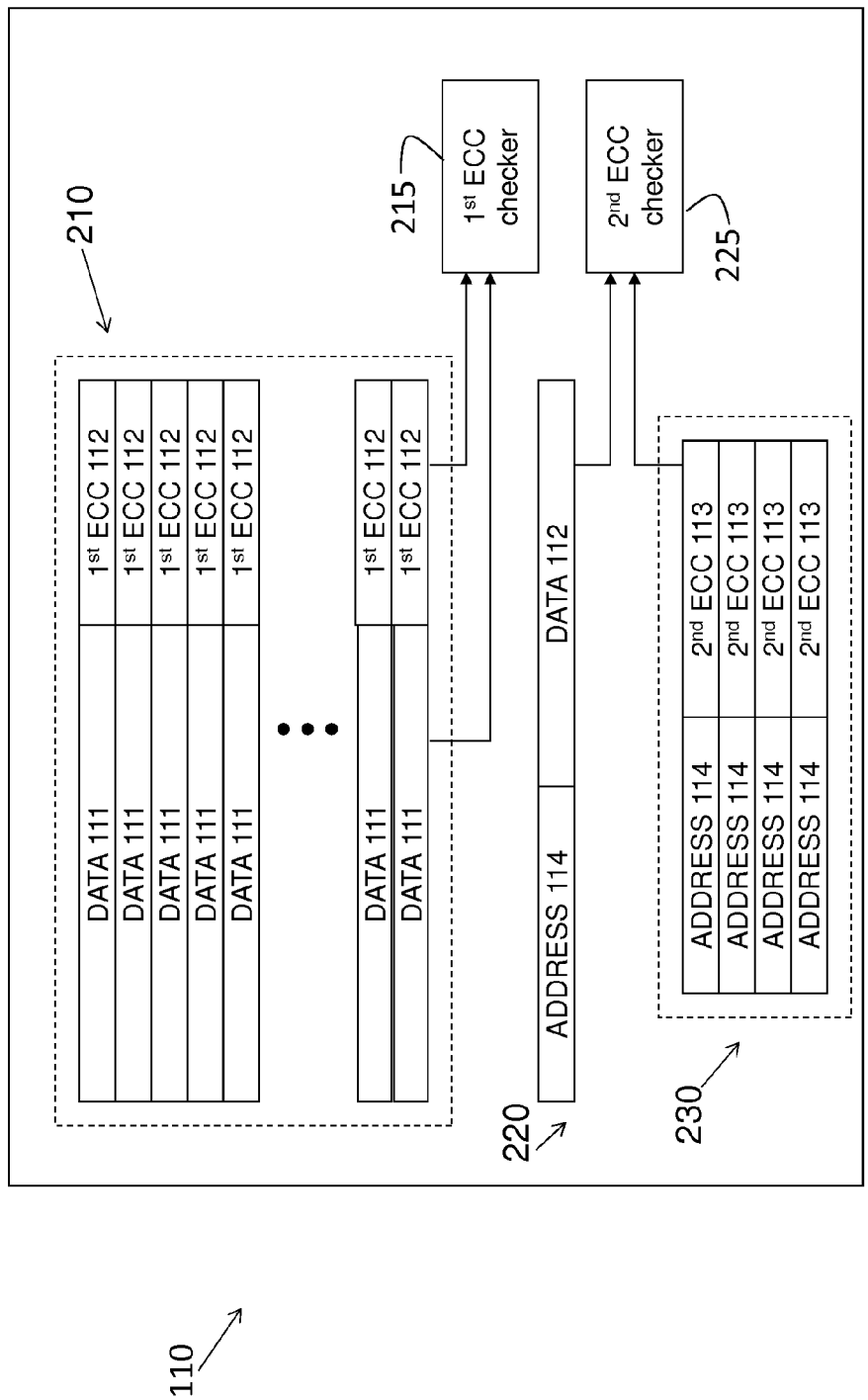
FIG. 2 is a memory device including an extended ECC table according to an embodiment.

FIG. 2 is a memory device 110 including an extended ECC table 230 according to an embodiment. The memory device 110, according to the embodiment shown in FIG. 2, includes a memory array 210 for storing data 111 and associated first ECC bits 112, a buffer 220, and an extended ECC table 230. The extended ECC table 230 may be non-volatile memory, for example. A first ECC checker 215 and second ECC checker 225 are also part of the memory device 110. Requested data 111 is first read out, with the associated first ECC bits 112, from the memory array 210. The data 111 and ECC bits 112 are input to the first ECC checker 215. When a correctable error is found in the read out data 111, the first ECC bits 112 are used to correct the data 111. However, when an uncorrectable error is part of the data 111 that is read out of the memory array 210, the data 111 and corresponding address 114 within the memory array 210 are put in the buffer 220. The data 111 in the buffer 220 (which has an uncorrectable error) is associated with second ECC bits 113 that are stored in the extended ECC table 230. The association may be done based on the address 114 corresponding with the data 111 in the buffer 220 and the address 114 corresponding with the second ECC bits 113 in the extended ECC table 230. The data 111 in the buffer 220 and the associated second ECC bits 113 in the extended ECC table 230 are provided to the second ECC checker 225 to correct the data 111, which has an error that is uncorrectable based on the first ECC bits 112. An exemplary embodiment of this flow is further detailed below.

In an alternate embodiment, the extended ECC table 230 may have read-only addresses 114. That is, the memory device 110 manufacturer may detect errors during final tests after packaging and may hard-program addresses 114 into the extended ECC table 230 in nonvolatile memory, for example. In this case, the second ECC bits 113 in the extended ECC table 230 would be read/writable, but the addresses 114 would be read-only. When a soft error happens in data 111 associated with one of the addresses 114 in the extended ECC table 230, and if the first ECC bits 112 can correct only one error bit, the second ECC bits 113 may correct the total two bits of error. That is, the first ECC bits 112 may be single-bit correctable double-bit detectable, and the second ECC bits 113 may be double-bit correctable and triple-bit detectable. Alternately, the first ECC bits 112 may be single-bit correctable only (double-bit not detectable) and the second ECC bits 113 may be single-bit correctable and double-bit detectable or double-bit correctable and triple-bit detectable. Keeping the first ECC bits 112 simpler minimizes the area overhead while using the second ECC bits 113 provides higher ECC coverage for worse memory cells.

Figure 3:
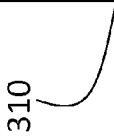
FIG. 3 shows instructions to manage the memory device according to the embodiment discussed with reference to FIG. 2.

FIG. 3 shows instructions 310 to manage the memory device 110 according to the embodiment discussed with reference to FIG. 2. As indicated, data 111 and associated first ECC bits 112 are fetched from the memory array 210. When there is a correctable error (CE) in the data 111, the corrected data 111 (output from the first ECC checker 215) is sent and the correctable error is reported. When the error is not a correctable error (i.e., the error is an uncorrectable error (UE)), then the extended ECC table 230 is consulted. When the address 114 corresponding to the data 111 with the uncorrectable error is found in the extended ECC table 230, then the second ECC bits 113 corresponding with the same address 114 are used with the second ECC checker 225 and the corrected data 111 is sent. When the uncorrectable error cannot be corrected with the second ECC bits 113, then the uncorrectable error is reported. When the address 114 corresponding to the data 111 with the uncorrectable error cannot be found in the extended ECC table 230 (i.e., there are no second ECC bits 113 corresponding to the data 111 with the uncorrectable error), then the uncorrectable error is reported.

FIG. 4 shows instructions 410 to create or add to the extended ECC table 230 according to an embodiment. The exemplary instructions shown in FIG. 4 refer to a DRAM as the memory device 110. The exemplary instructions may be processed by the processing system 120 acting as a memory controller. The exemplary instructions are on a per-address basis but, in alternate embodiments, a history buffer may be maintained such that all addresses 114 requiring the second ECC bits 113 may be added to the extended ECC table 230 at once. As the instructions indicate, when a read error is encountered (i.e., error in data 111 read from the memory array 210), the read is retried to determine if it is a hard (persistent) error or a soft error that does not require additional ECC bits. If there is a correctable error following the read retry, the error counter for the memory device 110 (DRAM) is incremented and, if a threshold number of the correctable errors has been exceeded, the second ECC bits 113 are calculated and added to the extended ECC table 230. If there is an uncorrectable error in the readout data, the error is corrected and the second ECC bits 113 are calculated and added to the extended ECC table 230 for the address 114 of the data 111 with the uncorrectable error. The instructions shown in FIG. 4 indicate that the extended ECC table 230 is used for correctable errors over a threshold number as well as for uncorrectable errors. In alternate embodiments, the extended ECC table 230 may be used only for uncorrectable errors or for all errors. Ultimately, the choice of what and how much to include in the extended ECC table 230 is a tradeoff between increased error correction capability and additional resource usage in the form of the extended ECC table 230.

Figure 5:
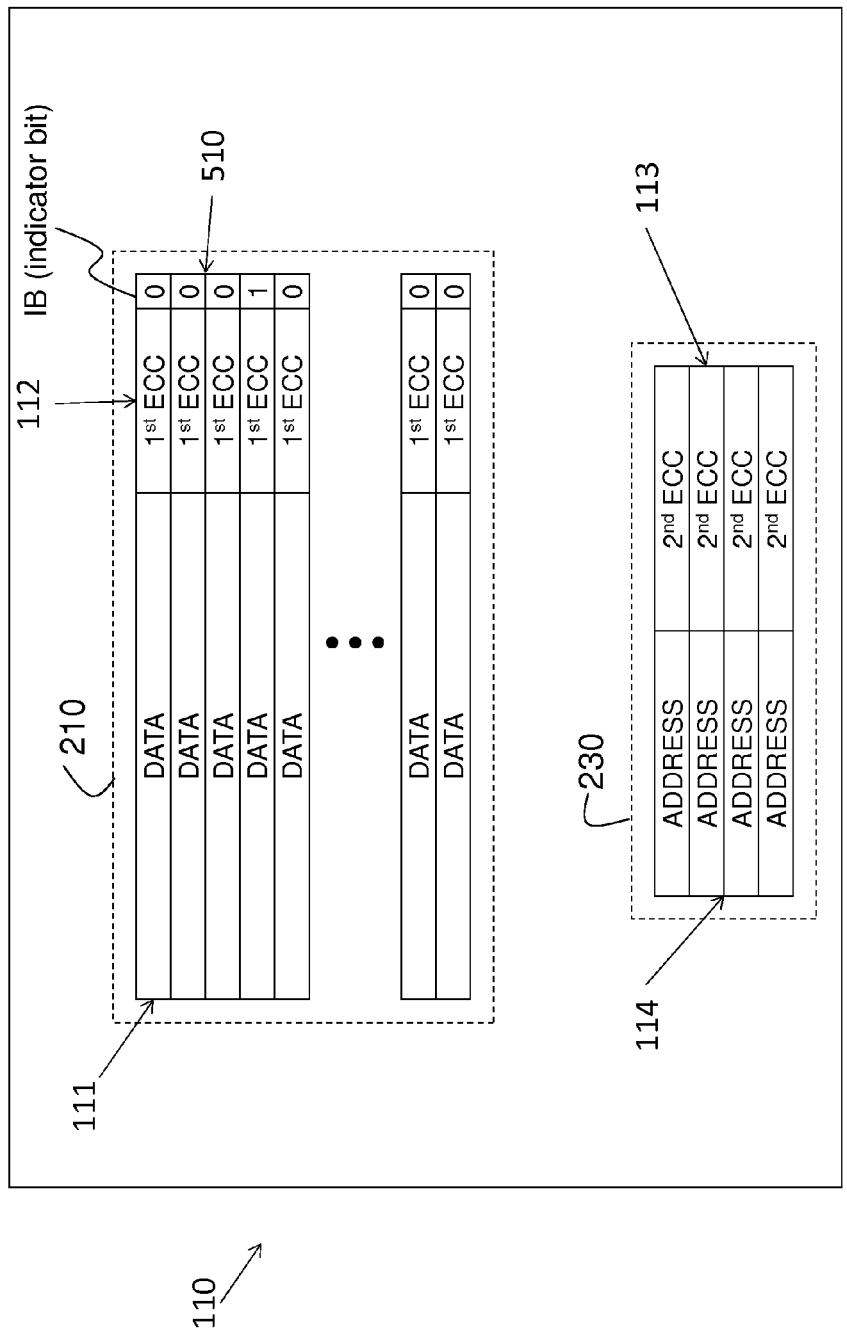
FIG. 5 is a memory device including an extended ECC table according to another embodiment.

FIG. 5 is a memory device 110 including an extended ECC table 230 according to another embodiment. The first ECC checker 215, second ECC checker 215, and buffer 220 are not specifically shown again in FIG. 5, but the embodiment of FIG. 5 includes these components. The present embodiment pertains to including an indicator bit (IB) 510 in the memory array 210. The IB 510 indicates whether the data 111 in the memory array 210 has corresponding second ECC bits 113 in the extended ECC table 230. Because of the IB 510, the step discussed with reference to FIG. 3 of looking for the second ECC bits 113 and possibly not finding an entry in the extended ECC table 230 is avoided. Further, correction using the first ECC bits 112 (and the first ECC checker 215) may be avoided altogether when the IB 510 indicates that second ECC bits 113 are available for the data 111.

Figure 6:
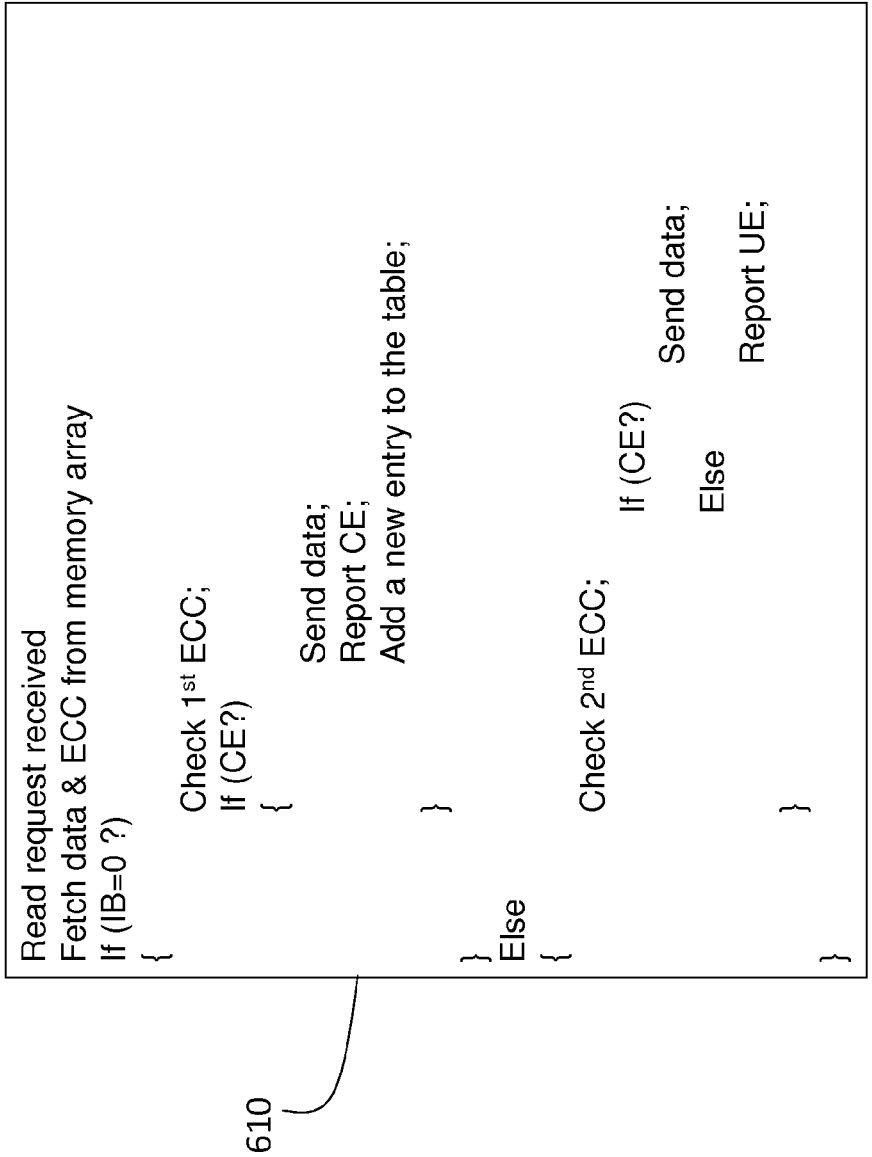
FIG. 6 shows instructions to manage the memory device according to the embodiment discussed with reference to FIG. 5.

FIG. 6 shows instructions 610 to manage the memory device 110 according to the embodiment discussed with reference to FIG. 5. As the exemplary instructions indicate, the IB 510 corresponding with data 111 that is fetched from the memory array 210 is checked. If the IB 510 is 0 and there is a correctable error, the first ECC bits 112 corresponding with the data 111 are used (with the first ECC checker 215) to correct the data 111. The corrected data 111 and report of the correctable error are sent. If the IB 510 is not 0 (i.e., IB is 1), then the second ECC bits 113 are used, and the instructions indicate that the memory device 110 should correct a correctable error and send the corrected data 111 or to report an uncorrectable error.

Figure 7:
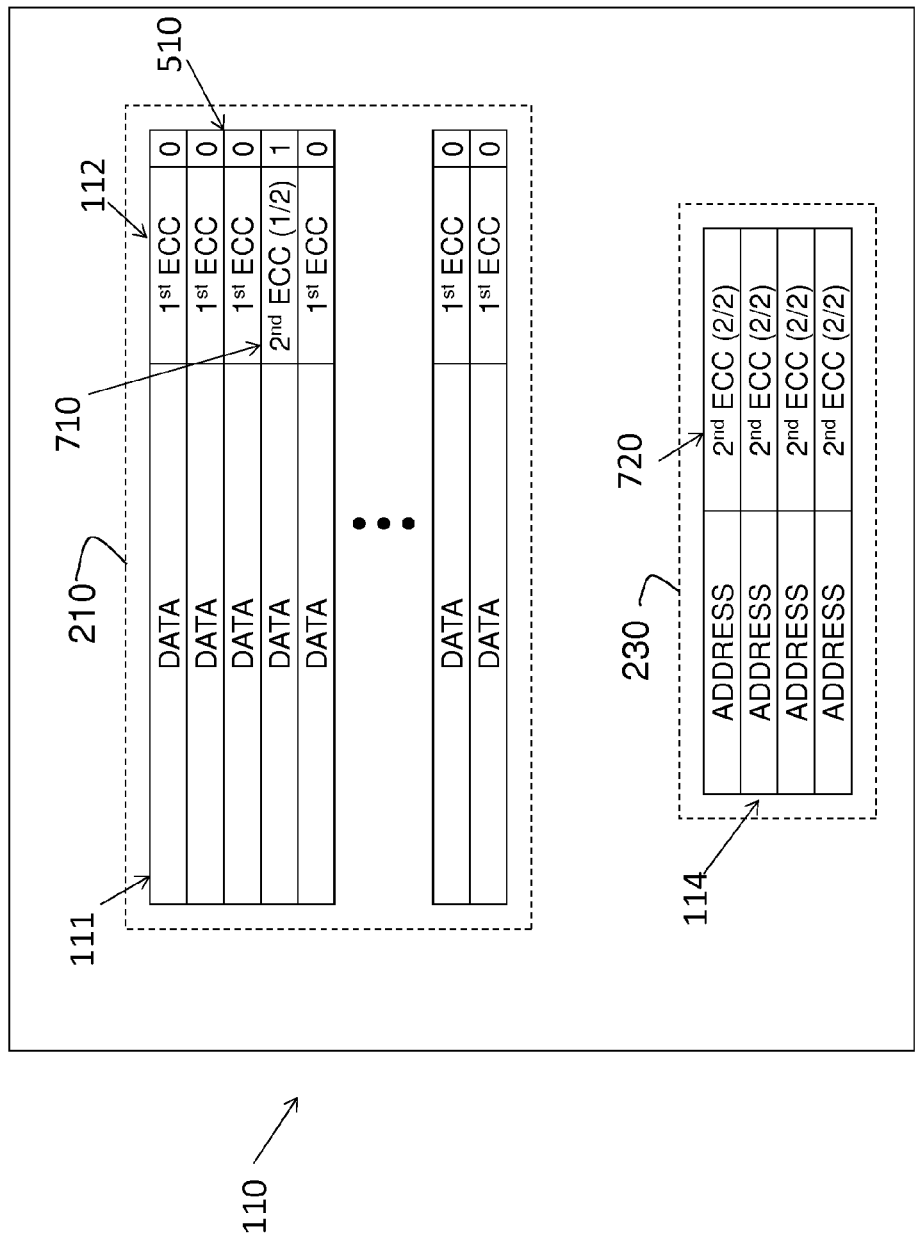
FIG. 7 is a memory device including an extended ECC table according to yet another embodiment.

FIG. 7 is a memory device 110 including an extended ECC table 230 according to yet another embodiment. In the embodiment shown in FIG. 7, the memory array 210 does not include only first ECC bits 112 in conjunction with data 111. When the indicator bit (IB) 510 is 1, a first part of second ECC bits 710 is included in the memory array 210. The second part of second ECC bits 720 is in the extended ECC table 230. Stronger error correction requires more bits (more storage) of ECC bits. Thus, some data 111 according to the present embodiment has no first ECC bits 112 associated with it but does have stronger second ECC bits as a combination of the first part of second ECC bits 710 and the second part of second ECC bits 720. Again, the first ECC checker 215, second ECC checker 225, and buffer 220 are not shown but are used for data 111 correction.

FIG. 8 shows instructions 810 to manage the memory device 110 according to the embodiment discussed with reference to FIG. 7. Similarly to the embodiment discussed with reference to the instructions 610 shown in FIG. 6, the IB 510 corresponding with data 111 that is fetched from the memory array 210 is checked. If the IB 510 is 0 and there is a correctable error, the first ECC bits 112 corresponding with the data 111 are used (with the first ECC checker 215) to correct the data 111. The corrected data 111 and report of the correctable error are sent. If the IB 510 is not 0 (i.e., IB is 1), then the first part of second ECC bits 710 are fetched from the memory array 210 and the second part of second ECC bits 720 are fetched from the extended ECC table 230 to make up a complete ECC word. This word is used to correct the data 111 and send corrected data 111 or is used to determine and report an uncorrectable error.

Figure 9:
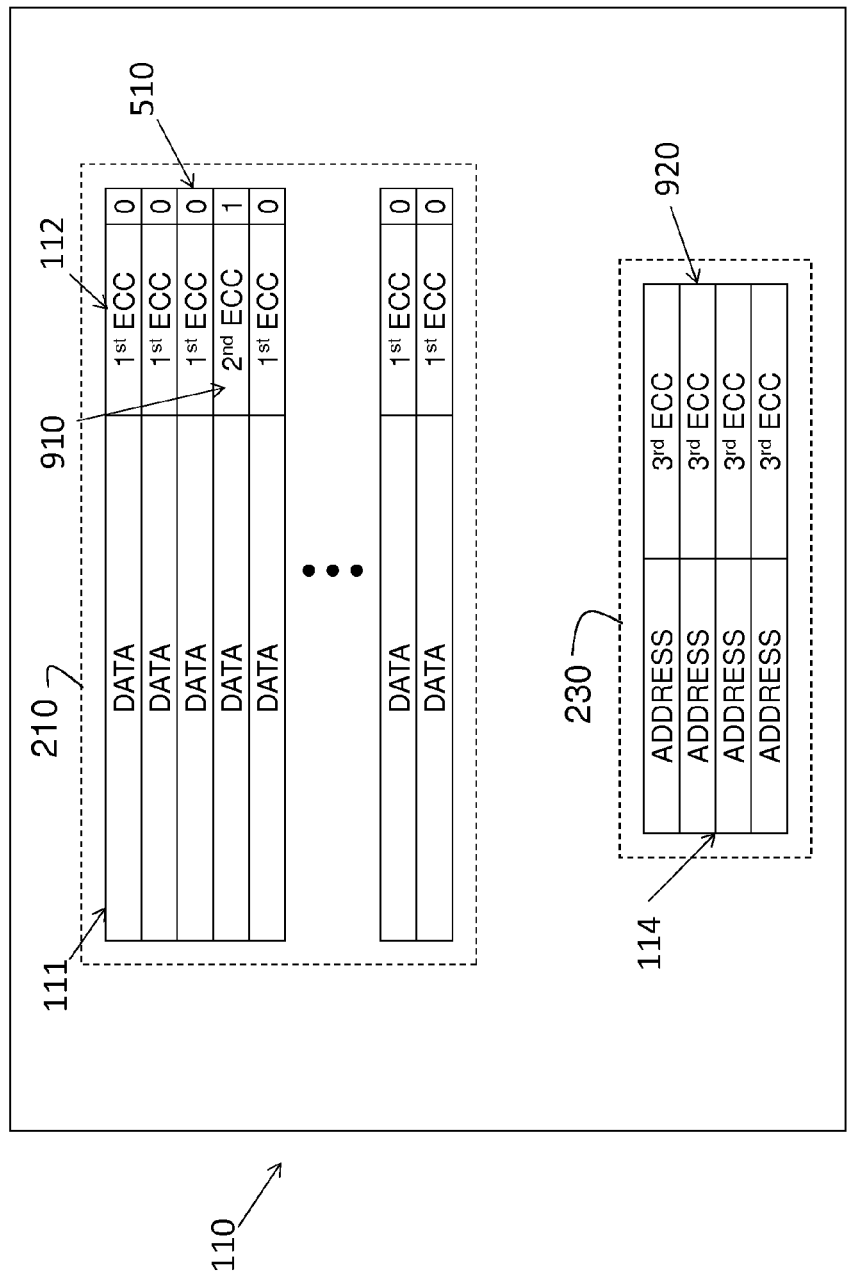
FIG. 9 is a memory device including an extended ECC table according to yet another embodiment.

FIG. 9 is a memory device 110 including an extended ECC table 230 according to yet another embodiment. In the embodiment shown in FIG. 9, similarly to the embodiment shown in FIG. 7, the memory array 210 does not include only first ECC bits 112 in conjunction with data 111. When the indicator bit (IB) 510 is 1, second ECC bits 910 are in the memory array 210 and third ECC bits 920 are in the extended ECC table 230. The second ECC bits 910 are only for error identification and have stronger error detection capability than the first ECC bits 112. When IB 510 is 1, the second ECC bits 910 are used for error detection but the third ECC bits 920 in the extended ECC table 230 must be used for correction of data 111. Again, the first ECC checker 215, second ECC checker 225, and buffer 220 are not shown but are used for data 111 correction.

FIG. 10 shows instructions 1010 to manage the memory device 110 according to the embodiment discussed with reference to FIG. 9. As with previously discussed embodiments, when IB 510 is 0, the first ECC bits 112 corresponding with fetched data 111 are used to correct correctable errors, send corrected data 111, and report the correctable error. When IB 510 is 1, the second ECC bits 910 in the memory array 210 are used for error detection. When there is no error in the data 111, the data 111 is sent. If the second ECC bits 910 indicate an error in the data 111, the third ECC bits 920 are fetched from the extended ECC table 230. When there is a correctable error, the third ECC bits 920 (and second ECC checker 225) are used to correct the data 111 and send the corrected data 111. When there is an uncorrectable error, it is reported.

Figure 11:
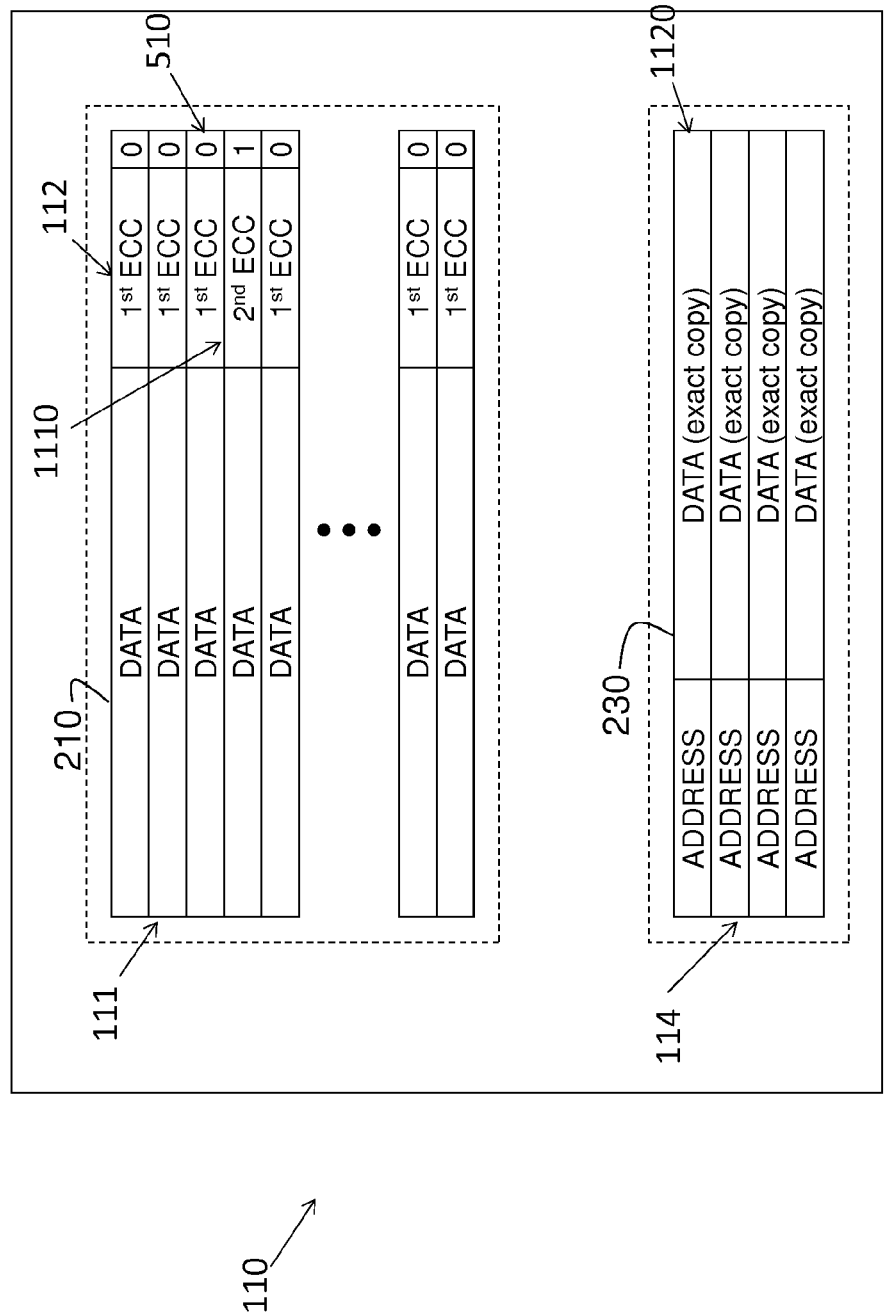
FIG. 11 is a memory device including an extended ECC table according to yet another embodiment.

FIG. 11 is a memory device 110 including an extended ECC table 230 according to yet another embodiment. Unlike the previously discussed embodiments that all include a buffer 220, a first ECC checker 215, and second ECC checker 225, the present embodiment may not require a second ECC checker 225 in addition to the first ECC checker 215, as further discussed below. When the indicator bit IB 510 is 1, it indicates that second ECC bits 1110 are stored in the memory array 210 in conjunction with the data 111 and that an exact copy of the data 1120 is stored in the extended ECC table 230. The exact copy of the data 1120 may be used as the corrected data 111. In this case, the second ECC checker 225 is not needed. Alternately, the exact copy of the data 1120 may be compared with the data 111 from the memory array 210 by a version of the second ECC checker 225.

Figure 12:
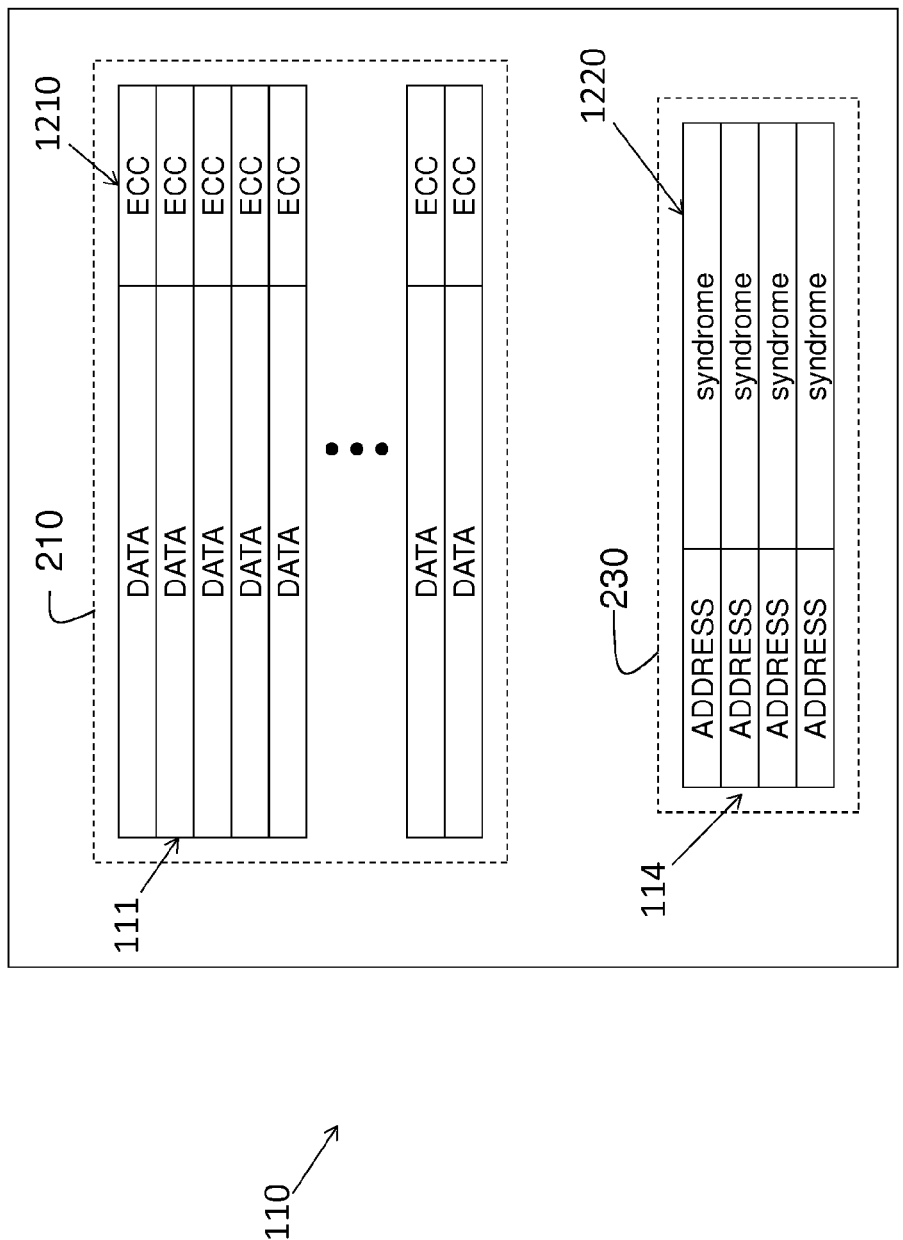
FIG. 12 is a memory device including an extended ECC table according to yet another embodiment.

FIG. 12 is a memory device 110 including an extended ECC table 230 according to yet another embodiment. According to the present embodiment, the memory array 210 includes ECC bits 1210 associated with data 111. The memory array 210 is, thus, like a standard memory array of a previous memory device. The extended ECC table 230 in this embodiment includes a syndrome 1220 associated with addresses 114. The syndromes 1220 facilitate health monitoring of the memory device 110 by indicating the address 114 and associated type of error (syndrome 1220). This health monitoring is further clarified in the discussion of FIG. 13 below. A second ECC checker 225 is not needed in the present embodiment but a first ECC checker 215 and buffer 220 (not shown) are still needed.

FIG. 13 shows instructions 1310 to manage the memory device 110 according to the embodiment discussed with reference to FIG. 12. As the instructions indicate, data 111 and ECC bits 1210 are fetched. If an error is detected, it is assumed to be correctable. The data 111 is corrected using the ECC bits 1210 and the corrected data 111 is sent. The address 114 of the data 111 is then searched in the extended ECC table 230. If the address 114 is not found or if the syndrome 1220 associated with the address 114 in the extended ECC table 230 is not the same as the current error, the address 114 and the data 111 are added to a buffer 220. An attention flag is sent using an alert pin or by corrupting the next data 111 read out. When the memory controller (processing system 120) receives the attention flag, it stores the information in the buffer 220 and determines whether to add the address 114 and syndrome 1220 to the extended ECC table 230. The syndrome 1220 being found in the extended ECC table 1220 indicates that the error in the data 111 is a known error. In that case, the read process is not interrupted in the case of a stuck memory cell, for example, that will generate repeated errors.

Figure 14:
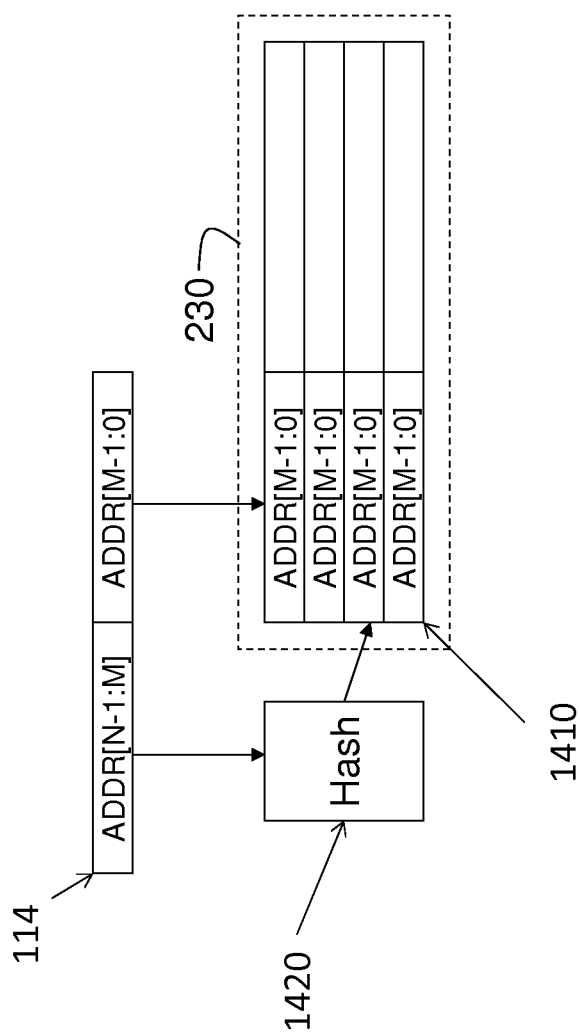
FIG. 14 illustrates an alternate embodiment for the extended ECC table.

FIG. 14 illustrates an alternate embodiment for the extended ECC table 230. Instead of the exact address 114 being stored in the extended ECC table 230, a hash key 1410 is stored instead based on a hash function 1420. This would save memory usage for the extended ECC table 230.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of managing a memory device, the method comprising:
   storing, using a memory controller, data and associated error correction coding (ECC) bits in a memory array of the memory device;
   storing, using the memory controller, information additional to the ECC bits in correspondence with one or more of the data in an extended correction table in the memory device, the information additional to the ECC bits indicates an address of the one or more of the data and includes correction information, wherein the correction information is additional ECC bits, a copy of the one or more of the data, or an indication of a type of error in the one or more of the data;
   determining that the one or more of the data has information additional to the ECC bits stored in correspondence in the memory device; and
   correcting, in the memory device, the one or more of the data using the ECC bits and the information addition to the ECC bits prior to outputting the data in the memory array.

2. The method according to claim 1, further comprising storing second ECC bits in the extended correction table in association with one or more addresses corresponding with one or more of the data in the memory array as the correction information.

3. The method according to claim 1, further comprising storing, in the memory array, an indication bit associated with each associated pair of the data and the ECC bits, the indication bit indicating whether the pair has a corresponding entry in the extended correction table, wherein the determining that the one or more of the data has information additional to the ECC bits stored in correspondence in the memory device is based on the indication bit.

4. The method according to claim 3, further comprising, when the indication bit associated with an associated pair of the data and the ECC bits in the memory array indicates a corresponding entry in the extended correction table, storing second ECC bits in the extended correction table as the correction information in association with the pair of the data and the ECC bits in the memory array.

5. The method according to claim 3, further comprising, when the indication bit associated with an associated pair of the data and the ECC bits in the memory array indicates a corresponding entry in the extended correction table, storing a first set of second ECC bits as the ECC bits in the memory array and storing a second set of the second ECC bits in the extended correction table as the correction information associated with the pair of the data and the ECC bits in the memory array, the first set and the second set of the ECC bits comprising a second ECC word.

6. The method according to claim 3, further comprising, when the indication bit associated with an associated pair of the data and the ECC bits in the memory array indicates a corresponding entry in the extended correction table, storing second ECC bits as the ECC bits in the memory array and storing third ECC bits in the extended correction table as the correction information in association with the pair of the data and the ECC bits in the memory array.

7. The method according to claim 3, further comprising, when the indication bit associated with an associated pair of the data and the ECC bits in the memory array indicates a corresponding entry in the extended correction table, storing second ECC bits as the ECC bits in the memory array and storing an exact copy of the corresponding data stored in the memory array in the extended correction table as the correction information in association with the pair of the data and the ECC bits in the memory array.

8. The method according to claim 1, further comprising storing, in the extended correction table, addresses corresponding with the one or more of the data in the memory array and, for each of the addresses, a corresponding syndrome indicating an error type at the address that is not already stored as the correction information.

9. The method according to claim 1, further comprising storing, in the extended correction table, addresses corresponding with the one or more of the data in the memory array, wherein the addresses are read-only and information in the extended correction table corresponding with the addresses is read-and-write.

* * * * *